(12) United States Patent
Badri et al.

(10) Patent No.: US 11,397,155 B2
(45) Date of Patent: Jul. 26, 2022

(54) KEROGEN MATURITY AND POROSITY IN SHALE

(71) Applicant: SCHLUMBERGER TECHNOLOGY CORPORATION, Sugar Land, TX (US)

(72) Inventors: Mohammed Badri, Al-Khobar (SA); Reza Taherian, Missouri City, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 99 days.

(21) Appl. No.: 16/491,987

(22) PCT Filed: Mar. 7, 2018

(86) PCT No.: PCT/US2018/021241
§ 371 (c)(1),
(2) Date: Sep. 6, 2019

(87) PCT Pub. No.: WO2018/165224
PCT Pub. Date: Sep. 13, 2018

(65) Prior Publication Data
US 2021/0140902 A1    May 13, 2021

Related U.S. Application Data

(60) Provisional application No. 62/467,992, filed on Mar. 7, 2017.

(51) Int. Cl.
*G01N 24/08* (2006.01)
*G01R 33/30* (2006.01)
(Continued)

(52) U.S. Cl.
CPC .......... *G01N 24/081* (2013.01); *G01R 33/30* (2013.01); *G01R 33/448* (2013.01); *G01V 3/32* (2013.01)

(58) Field of Classification Search
CPC .... G01N 24/081; G01R 33/30; G01R 33/448; G01V 3/32
See application file for complete search history.

(56) References Cited

U.S. PATENT DOCUMENTS

2001/0035751 A1* 11/2001 Heaton ................. G01R 33/56
324/303
2010/0264915 A1   10/2010 Saldungaray et al.
(Continued)

*Primary Examiner* — Gregory H Curran (57) ABSTRACT

A system having an NMR measurement device make measurements on a region of investigation in which an NMR-active fluid has been injected. A source of the NMR-active fluid (e.g., methane) is provided, and the pressure of the region of investigation may be monitored. A sealing apparatus serves to isolate the region of investigation. A parameter is estimating using the obtained measurement. The parameter estimated may include the inter-granular porosity, intra-kerogen porosity, kerogen maturity, free gas volume, and/or adsorbed gas volume. A baseline measurement may be made prior to injecting the NMR-active fluid, and the region of investigation may be evacuated before injecting the NMR-active fluid. The obtained T2 distribution can be resolved and each peak attributed to different constituent sources of the signal. The system can be conveyed into a wellbore using a drillstring, a wireline, a slickline, or a coil tubing.

20 Claims, 5 Drawing Sheets

(51) Int. Cl.
*G01R 33/44* (2006.01)
*G01V 3/32* (2006.01)

(56) References Cited

U.S. PATENT DOCUMENTS

| | | |
|---|---|---|
| 2012/0024523 A1 | 2/2012 | Ayan et al. |
| 2012/0169334 A1* | 7/2012 | Hopper ................ G01N 24/081 324/303 |
| 2013/0200890 A1* | 8/2013 | Hursan .................... G01V 3/32 324/303 |
| 2015/0219782 A1 | 8/2015 | Kadayam Viswanathan et al. |
| 2016/0178786 A1 | 6/2016 | Badri et al. |
| 2016/0334347 A1 | 11/2016 | Valori et al. |

* cited by examiner

KEROGEN MATURITY AND POROSITY IN SHALE

BACKGROUND OF THE DISCLOSURE

The maturity of a shale play is an important economic parameter in that it reflects the potential of a formation to produce oil and gas. Maturity indicates the extent to which the shale has been subjected to thermal heating. Geothermal heating is one of the factors causing the organic content of shales to decompose and transform to oil or gas. Normally, at deep enough burial depths where the temperature is sufficiently high to thermally decompose the organic matter, the shale plays contain oil and gas and thus have economic value. There is a range of thermal maturities that accompanies (i.e., correlates to) producible oil and gas.

Shale oil/gas formations are known to have two different types of porosity. The void space between the grains (i.e., matrix material), which is generally referred to as "porosity" in conventional formations, is partly filled with kerogen. Any pore space left (i.e., not filled with kerogen) is called the "inter-granular (IG) porosity". The IG porosity is similar to the conventional porosity except the space is much smaller. As a result, any molecule such as gas in this space has a rather short nuclear magnetic resonance (NMR) T2 distribution. A fraction of gas in this pore space is bound to the wall (which is typically clay), causing its NMR T2 distribution to be even shorter. The remaining volume of gas is free gas and is the fraction of the gas that is produced first. Knowing the volume of gas in these pores provides an estimate of the free gas portion, which has important immediate commercial implications.

The portion of the rock filled with kerogen has its own porosity in the form of small pores within the organic mass of kerogen. This unique porosity is referred to as "intra-kerogen (IK) porosity". These pores are much smaller than IG porosity pores and lead to NMR T2 distributions that are also short. The molecules in these pores are bound to hydrocarbon groups in the structure of the kerogen, but those bonds are generally weaker than the (clay) surface bonds. As a result, the molecules in the IK pore space have T2 distributions that are longer than that of clay-bound molecules, but shorter than those filling the IG porosity. Knowing the volume of gas in the IK pore space provides an estimate of the adsorbed gas portion, which has important long-term commercial implications. Thus, it is important to measure the (geothermal) maturity of a shale play to assess the economic viability of a shale formation.

Geothermal maturity of shale plays is commonly determined by measuring the reflectance of vitrinite and correlating that to a desired property. Vitrinite is a common constituent of coal that is derived from vascular land plants, and may or may not be present in a shale play (at least not in sufficient quantities to make a reflectance measurement possible). Vitrinite reflectance has been empirically related to the degree of geothermal alteration of petroleum source rocks in a sedimentary basin, and a vitrinite reflectance scale has been developed and is commonly used. However, this is not a direct measurement of kerogen, but rather a correlation to a different component of the shale play.

SUMMARY

A system having an NMR measurement device makes measurements on a region of investigation in which an NMR-active fluid has been injected. A source of the NMR-active fluid (e.g., methane) is provided, and the pressure of the region of investigation may be monitored. A sealing apparatus serves to isolate the region of investigation. A parameter is estimating using the obtained measurement. The parameter estimated may include the inter-granular porosity, intra-kerogen porosity, kerogen maturity, free gas volume, and/or adsorbed gas volume. A baseline measurement may be made prior to injecting the NMR-active fluid, and the region of investigation may be evacuated before injecting the NMR-active fluid. The obtained T2 distribution can be resolved and each peak attributed to different constituent sources of the signal. The system can be conveyed into a wellbore using a drillstring, a wireline, a slickline, or a coil tubing.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Embodiments are described with reference to the following figures. The same numbers are generally used throughout the figures to reference like features and components.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Some embodiments will now be described with reference to the figures. Like elements in the various figures may be referenced with like numbers for consistency. In the following description, numerous details are set forth to provide an understanding of various embodiments and/or features. However, it will be understood by those skilled in the art that some embodiments may be practiced without many of these details and that numerous variations or modifications from the described embodiments are possible. As used here, the terms "above" and "below", "up" and "down", "upper" and "lower", "upwardly" and "downwardly", and other like terms indicating relative positions above or below a given point or element are used in this description to more clearly describe certain embodiments. However, when applied to equipment and methods for use in wells that are deviated or horizontal, such terms may refer to a left to right, right to left, or diagonal relationship, as appropriate. It will also be understood that, although the terms first, second, etc. may be used herein to describe various elements, these elements should not be limited by these terms. These terms are only used to distinguish one element from another.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Shale plays are known to comprise inorganic matter (e.g., clays, silicon, and calcite, in various proportions) and organic matter (e.g., kerogen and its derivatives). Kerogen is the source (organic) compound, generating hydrocarbons such as oil and gas in situ. Conversion of kerogen to gas causes small pores (on the order of nanometers) to be formed in the structure of the kerogen. Those pores are usually filled with the gas. As a result, the porosity is divided into the inter-granular (IG) (or inorganic) porosity and intra-kerogen (IK) porosity.

A system and method to estimate the thermal maturity of kerogen in a shale formation based on the NMR response of the shale is described herein. The T2 distribution of gas molecules in the IK pores is resolved and correlated to the kerogen maturity. The separate contributions to the NMR signal of the gas attributed to the IK and IG pores can be determined, and thus estimates can be made as to the free gas and adsorbed gas volumes.

Figure 1:
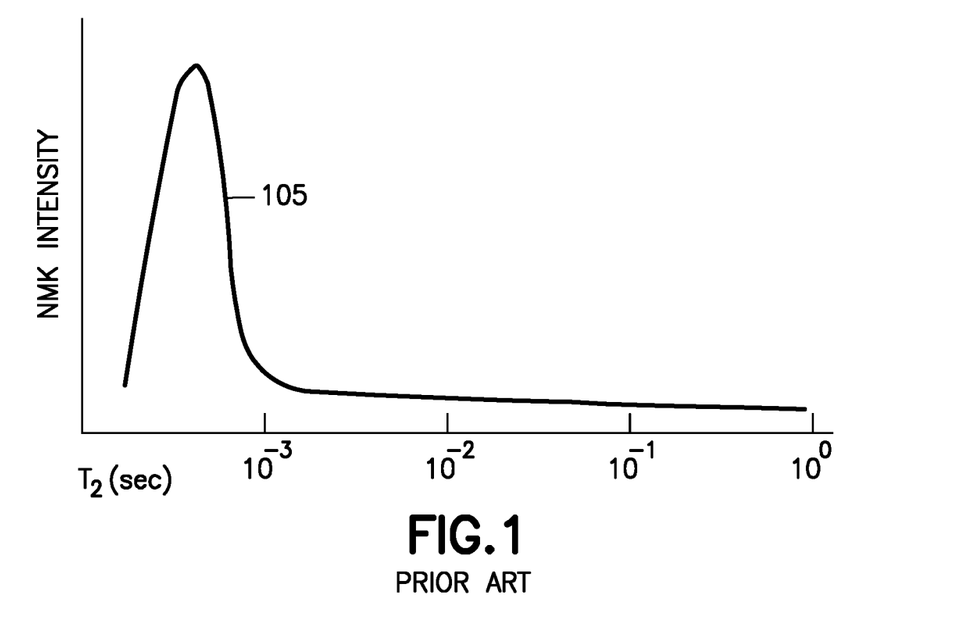
FIG. 1 is a graph of a typical T2 distribution for a sample of shale containing kerogen, as is known in the prior art.

FIG. 1 shows a typical (prior art) NMR response of an organic-bearing shale core sample (henceforth referred to herein as "shale"). As is customary, the temporal NMR response has been subjected to a Laplace transform to obtain the T2 distribution of the sample. The pore space of the shale sample contains kerogen, a very large organic molecule whose typical NMR response is a broad peak at very short T2 times. The pore space may also contain water molecules confined to the small pore or adsorbed to the clay on the pore wall. In either case, the T2 time is expected to be very short. For the example of FIG. 1, the core sample was kept in atmospheric conditions long enough for any gaseous hydrocarbons, such as methane, to escape. In addition, the sample does not contain any light liquid hydrocarbons in the pore space, as is evident from the lack of any peaks at longer T2 times (e.g., 500 to 2000 msec). As expected and found experimentally, there are no T2 peaks at long times (e.g., seconds); instead there is a large broad peak 105 at T2's below one msec. This peak 105 is attributed to kerogen and any bound water and gas that may be present.

Figure 2:
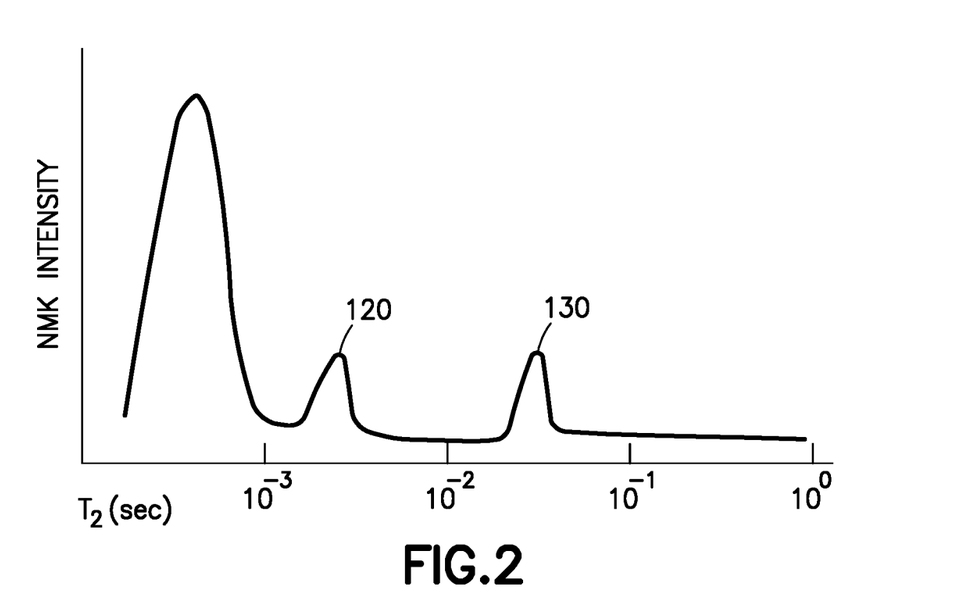
FIG. 2 is a graph of an example T2 distribution for a sample of shale containing kerogen and injected fluid, in accordance with the present disclosure.

If the sample is now subjected to pressure injection of methane, for example, two new peaks appear in the T2 distribution of the sample, as shown in FIG. 2. In addition to peak 105, which was present before gas injection, two new peaks 120, 130 appear in the T2 spectrum (distribution) of the shale sample under gas pressure. Since peaks 120, 130 appear only after gas is injected into the pore space, they are deemed due to the gas, and since they are distinct peaks, they indicate that there are two distinct environments where the gas resides.

In the example of FIG. 2, the peaks 120, 130 are separate from peak 105, but depending on the detailed structure of the pore space, one of them may be close enough to peak 105 to overlap. In these cases a growth in the intensity of peak 105, instead of a distinct peak 120, is observed. Since NMR of the sample is generally measured before gas injection, the difference between the intensity of peak 105 before and after gas injection can be calculated and used.

The peak 130 is at relatively longer T2 values and is attributed to the gas in the IG pore space, which is mostly free gas. Peak 130 is centered at around 50 msec and is consistent with gas being in small enough pores that its T2 relaxation time has been reduced from 1-2 seconds (as usually seen in macro-pores) to 50 (to 100) msec due to the small diameter of micro-pores. Thus, the intensity of peak 130 provides information about the micro-pores, more specifically to IG porosity as well as the amount of gas present in these pores. As is known in the art, from the known gas pressure, the hydrogen index (HI) can be calculated and used to estimate the IG porosity of the sample.

The second peak 120 in FIG. 2 is centered at about 5 msec and originates from methane gas that is confined to the very small IK pores. These pores are generally much smaller than the entire pore and have diameters on the order of nanometers. Due to the smaller diameters of IK pores, the T2 distribution is expected to be centered at shorter T2 times, which explains why the T2 times of the gas in these pores is reduced from that in the IG pores (50-100 msec) to those of peak 120 (5 msec). The peak 120 provides information about the IK pores of the kerogen (kerogen porosity).

The distinct peak 120 can be used to estimate the porosity of kerogen and that porosity can be related to the kerogen maturity. Before kerogen is matured there are no pores in its structure. As it matures (over geological time spans), more and more of its mass is transformed into smaller hydrocarbons that leave the kerogen mass, forming the pores we refer to as IK pores. Because of that pore creation mechanism, the maturity and IK porosity are related.

Figure 3:
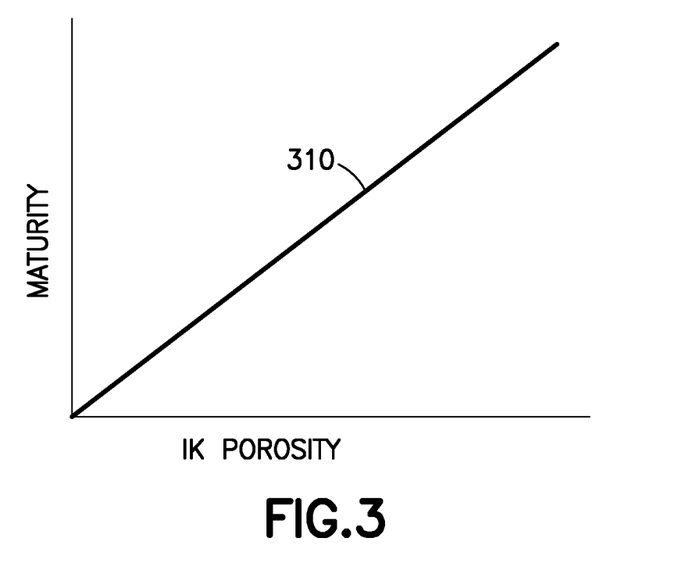
FIG. 3 is a graph showing the correlation between kerogen maturity and the intra-kerogen porosity, in accordance with the present disclosure.

This has been verified in the laboratory using a series of shale samples with different levels of kerogen maturity (determined using conventional methods such as vitrinite reflectance and also measuring their NMR responses). The intensity of the peak 120 (measured at the same gas pressure or corrected for variable gas pressure) is plotted against the maturity index of the shale in FIG. 3. The line 310 is the correlation found between these two parameters and can be used to estimate the kerogen maturity from the IK porosity of the sample. This line is an empirical finding that can serve as a look-up table.

NMR measurements can be performed on cores drilled from a well at various depths of interest. The coring can be a whole core or a side wall core, as is common in the art. When cores are not available, drill cuttings can be used. Drill cuttings are pieces of rock cut from the formation as a result of drilling operations and are brought to the surface by drilling fluid circulation. The cuttings are collected at the surface at time intervals believed to correspond to the depth of interest. In yet another embodiment, NMR measurements can be made downhole in the well at various depths of interest.

The cuttings can be cleaned to remove any drilling fluid and used as they are. If the size of the cuttings is too small for a useful NMR signal, more cuttings from the same depth range of interest can be compacted into a cylindrical shape to simulate a core and used in commercially available NMR instruments designed for laboratory purposes. In these measurements a core or a cutting is placed in an NMR instrument, and a known pressure of gas is injected into the core for a time long enough to build up the pressure in the pore space of the sample. Since shales are known to have very low permeability, the injected gas pressure is maintained at a desired level while NMR measurement is performed as a function of time. As the gas penetrates and enters the pore space, peaks 120, 130 are observed and their intensities increase as a function of time. The waiting continues until, for the applied gas pressure, the intensities of peaks 120 and 130 do not change. This is taken as an indication that the gas pressure in the pore space has equalized to the applied gas pressure. As indicated above, a portion of the measured NMR signal can be interpreted as originating from the IG pore space (equivalent of peak 130), from which the IG porosity can be determined knowing the hydrogen index (HI) from the applied gas pressure. Similarly, a second portion of the measured NMR signal can be interpreted as originating from the IK pore space (equivalent of peak 120), and can be used to estimate kerogen maturity.

Although in the foregoing discussion gas was injected into the pore space of the shale formation, the method is equally applicable to injecting other agents such as a liquid hydrocarbon, for example, into the pore space. Since proton NMR is capable of measuring hydrocarbon liquids or gases, the method described above can be used to determine the shale porosities and kerogen maturity. It is understood that the amount of time it takes for the injecting agent to enter the pore is a function of the shale permeability, which is generally higher for gaseous hydrocarbons than for liquid ones. Thus, if a liquid is injected, the experiment may take a proportionally longer time. Likewise, the method can be used with an agent other than the hydrocarbons that are naturally found in the pore space. For example, acetone, ether, alcohols, dimethyl sulfoxide, may be used, to name a few.

For ease of discussion we have limited the discussion to proton NMR; however, it should be understood that other isotopes/elements such as carbon 13, fluorine 19, and the like can be used. In the case of hydrocarbons, proton (hydrogen) and carbon 13 NMR are applicable. In some cases, one may want to use high-pressure to inject a fluorinated fluid such as $SF_6$ to fill up the pore space, in which case fluorine 19 NMR, as well as other NMRs, can be used to monitor what has entered the pore space of the formation. In general, any fluid that has non-zero spin (nuclear angular momentum) can be used as an NMR-active fluid. However, the NMR measurement device should be "tuned" to receive signal according to the NMR-active fluid used.

Figure 4:
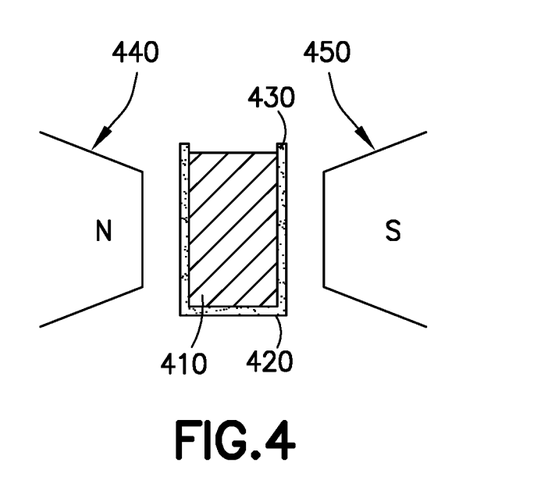
FIG. 4 is a schematic drawing of a sample being tested in a nuclear magnetic resonance device, in accordance with the present disclosure.

FIG. 4 shows an exemplary implementation for uphole environments where the core or cutting 410 is placed inside a non-metallic container 420 that is filled with gas 430 at a known pressure. Exemplary magnet poles 440, 450 are shown, but for clarity the bulk of the NMR instrument is not shown. In this embodiment, the instrument of FIG. 4 is used to measure the NMR response of the sample 410. In addition, the maturity of the samples can be measured using standard techniques to generate an empirical look-up table/graph (like FIG. 3), applicable to the oil field of interest. This graph can be compared to those from other fields to see if the lines 310 obtained for other (different) fields are the same or if the parameters are dependent on the specific oil field. If variation is observed, the graph specific to the current field is preferably used. The look-up table and the NMR measurement(s) are used to estimate the kerogen maturity.

For downhole applications, an NMR logging tool is conveyed to the depth of interest and the NMR response of the shale layer is measured. The conveyance method can be wireline, drill string, coil tubing, slick line, or any other convenient means. NMR logging tools already exist commercially for wireline and logging-while-drilling (LWD) applications. If needed, more specialized tools can be developed for the shale application. These tools may also be designed for other conveyance methods, if needed.

Figure 5:
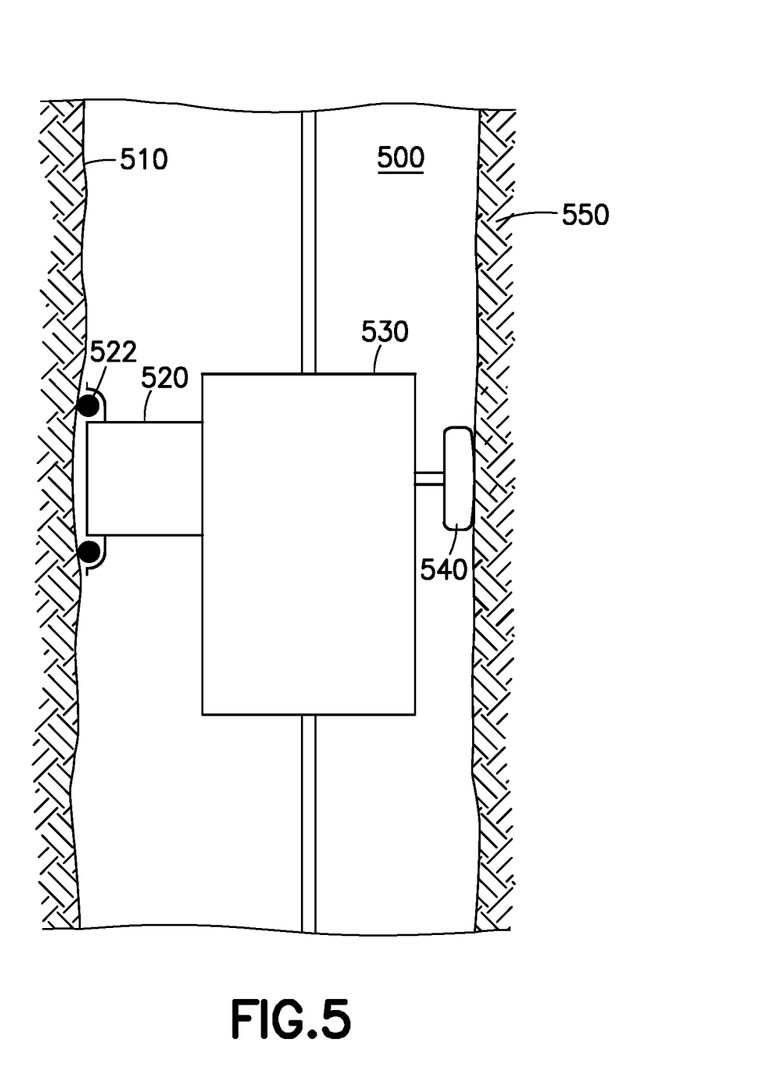
FIG. 5 is a schematic drawing (elevation view) of a downhole nuclear magnetic resonance device, in accordance with the present disclosure.

FIG. 5 shows one embodiment of a downhole application that is well suited for wireline conveyance. The well 500 is being investigated with the NMR instrument 520, which is pressed against the formation wall 510 using an extendible arm 540 on the side opposite NMR instrument 520. A rubber (sealing) ring 522 is pressed against the wall 510 to make a hydraulic seal (as is common with sampling tools, well known in the industry). A pump (not shown) is used to remove the fluid trapped between the wall 510 and the NMR instrument 520. The NMR instrument 520 makes an NMR measurement that is likely similar to FIG. 1 if all the gas has already escaped from the pore space of the shale formation 550. In the event that formation gas is still present, an analogue of FIG. 2 is generated. In most cases the gas pressure is somewhere between these two limits, leading to a distribution similar to that shown in FIG. 2, except the peaks 120, 130 may not have such high intensities. Using a mechanical unit such as a piston and cylinder filled with gas that can be located outside of or integral with module 530, a volume of gaseous hydrocarbon (methane, for example) is injected into the space between the wall 510 and instrument 520. The pressure is preferably kept constant and high, causing the peaks 120, 130 to increase in intensity. The growing peak intensities are monitored and used to confirm that these peaks are indeed due to the presence of gas. The module 530 may also be equipped with pressure sensors, thereby providing an estimate of the pressure of the gas in the pore space (which is substantially the same as the applied pressure at long enough times). As described above, the NMR response can be used to determine, for example, the IG porosity and kerogen maturity.

Figure 6:
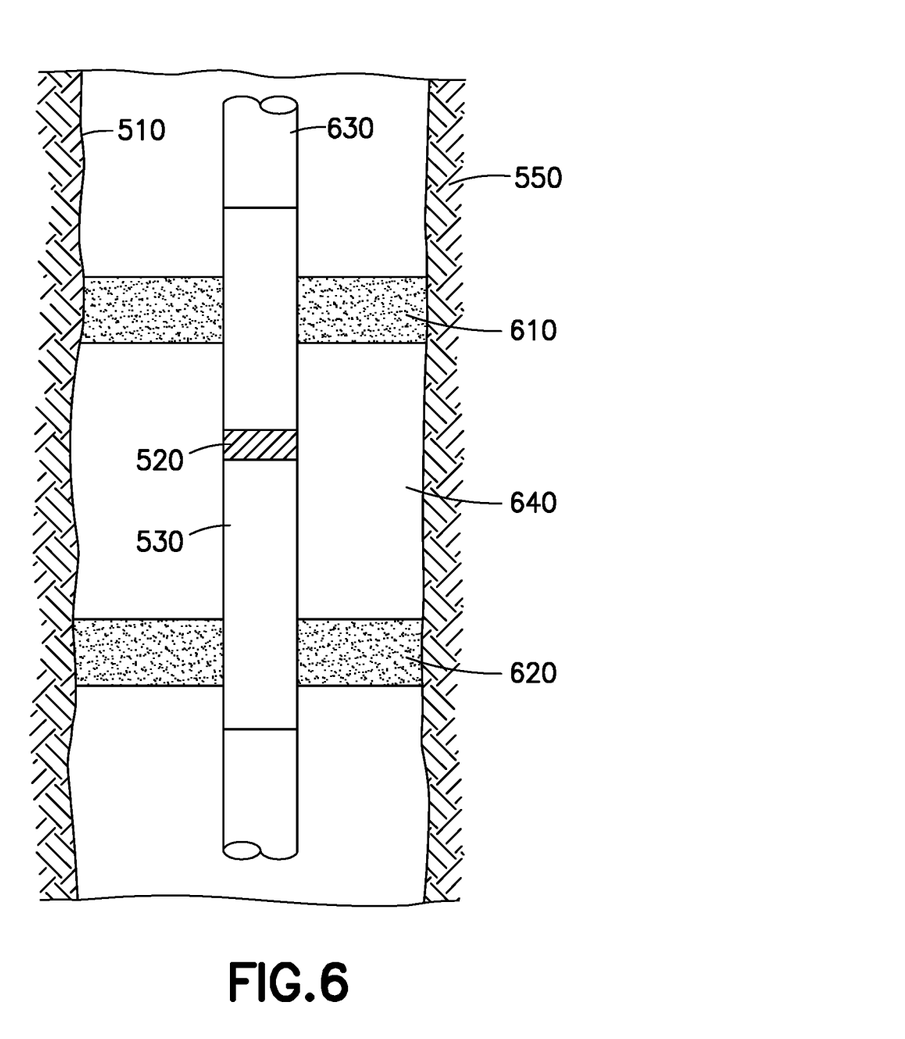
FIG. 6 is a schematic drawing (elevation view) of an alternative embodiment of a downhole nuclear magnetic resonance device, in accordance with the present disclosure.

FIG. 6 is an alternative embodiment that is suitable for LWD, wireline, or coil tubing conveyances. (In FIG. 6, a pump, a pressure measurement system, a gas supply tank, the details of an NMR instrument, etc., are not shown, for clarity.) The tool string 630 contains an NMR unit 520 and a mechanical unit (module) 530 as described above and shown in FIG. 5. In addition, the tool string 630 contains two packers 610, 620 that can be activated and cooperatively isolate a portion of the borehole 640. The isolated portion 640 is emptied by a pump within the mechanical unit 530 and a background NMR measurement is performed (yields an analogue of FIG. 1, FIG. 2, or a combination of the two based on the pressure history of the formation). Next, the isolated portion 640 is filled with a gaseous hydrocarbon (such as methane) and the NMR measurement is repeated until the intensity of peaks 120, 130 become time-independent. The intensities of the two peaks are interpreted as described above to obtain, for example, IG porosity and kerogen maturity.

For LWD conveyance, the tool string 630 in FIG. 6 can be drill pipe or other LWD tools in a bottomhole assembly. For wireline conveyance, the tool string 630 can be other wireline tools or a wireline cable. For coil tubing conveyance, the tool string 630 is similar to wireline but may preferably be lighter weight to ensure the coil tubing can push the measurement tool 520 farther in a horizontal well application.

As used herein, the phrase "region of investigation" applies to a laboratory situation as well as a downhole situation. The "region of investigation" refers to the volume for which the NMR measurement device is sensitive to and from which it can detect an NMR signal. The phrase "mechanical unit", as used herein, means a system having a container, piping or conduit, a pressure regulator, and a pressure sensor.

Figure 7:
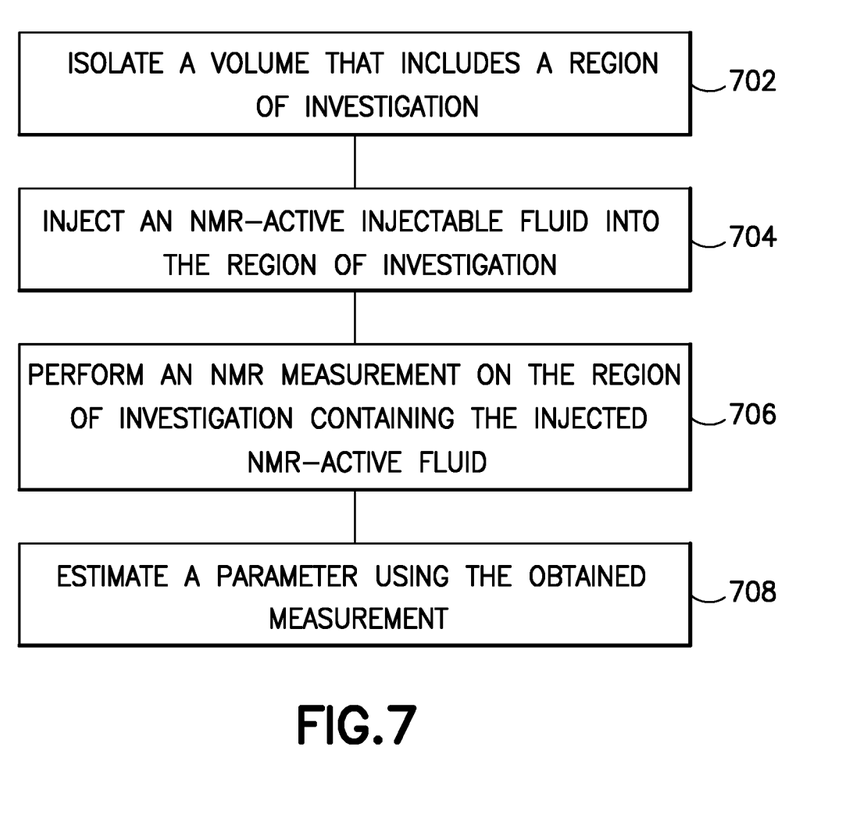
FIG. 7 is a flowchart to estimate a parameter such as inter-granular porosity or intra-kerogen porosity in shale using a nuclear magnetic resonance measurement, in accordance with the present disclosure.

FIG. 7 shows a flowchart illustrating an embodiment in accordance with this disclosure. In this embodiment, the workflow comprises: isolating a volume that includes a region of investigation (702); injecting an NMR-active injectable fluid into the region of investigation (704); performing an NMR measurement on the region of investigation containing the injected NMR-active fluid (706); and estimating a parameter using the obtained measurement (708).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the scope of the present disclosure, and that they may make various changes, substitutions, and alterations herein without departing from the scope of the present disclosure.

The Abstract at the end of this disclosure is provided to comply with 37 C.F.R. § 1.72(b) to allow the reader to quickly ascertain the nature of the technical disclosure. It is submitted with the understanding that it will not be used to interpret or limit the scope or meaning of the claims.

While only certain embodiments have been set forth, alternatives and modifications will be apparent from the above description to those skilled in the art. These and other alternatives are considered equivalents and within the scope of this disclosure and the appended claims. Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A system, comprising:
    a nuclear magnetic resonance (NMR) measurement device;
    a mechanical unit containing or in fluid communication with an NMR-active injectable fluid and capable of injecting the injectable fluid into a region of investigation; and
    a processor capable of estimating a parameter using data obtained by the NMR measurement device regarding the region of investigation having the injectable fluid injected therein, wherein the processor is configured to determine when pressure of applied NMR-active injectable fluid and pressure in pores in the region of investigation have equalized, and wherein the processor is further configured to compare initial peaks in a measured T2 distribution before injection of the NMR-active injectable fluid to final peaks in the measured T2 distribution after equalization and identify increase in intensity between the peaks, identify additional final peaks not present in the initial peaks, and using hydrogen index to identify inter-granular porosity for peaks centered at about 50 to 100 msec and identify intra-kerogen porosity from final peaks centered at less than 50 to 100 msec, and wherein the processor is further configured estimate kerogen maturity from the final peaks centered at less than 50 to 100 msec.

2. The system of claim 1, wherein the parameter estimated is selected from the group consisting of: inter-granular porosity, intra-kerogen porosity, kerogen maturity, free gas volume, and adsorbed gas volume.

3. The system of claim 1, wherein the system further comprises a sealing apparatus.

4. The system of claim 1, wherein the NMR-active injectable fluid is methane.

5. The system of claim 1, wherein the system can be conveyed into a wellbore using a logging-while-drilling drillstring, a wireline, a slickline, or a coil tubing.

6. The system of claim 1, wherein the region of investigation is within a volume selected from the group consisting of: a core sample, a drill cutting, a collection of drill cuttings, and a portion of a subsurface formation.

7. The system of claim 1, further comprising a non-metallic pressure vessel that contains a volume that includes the region of investigation.

8. A method, comprising:
isolating a volume that includes a region of investigation;
performing an NMR measurement on the region of interest to identify initial peaks and intensity;
injecting an NMR-active injectable fluid into the region of investigation;
performing an NMR measurement on the region of investigation containing the injected NMR-active fluid identifying final peaks;
determining final peaks aligning with the initial peaks and final peaks that are in addition to the initial peaks, and from the final peeks using hydrogen index to identify inter-granular porosity for peaks centered at about 50 to 100 msec and identify intra-kerogen porosity from final peaks centered at less than 50 to 100 msec, and estimating kerogen maturity from the final peaks centered at less than 50 to 100 msec.

9. The method of claim 8, further comprising:
evacuating at least a portion of any existing fluid between an NMR measurement device and the region of investigation prior to injecting the injectable fluid.

10. The method of claim 8, further comprising:
making a baseline NMR measurement on the region of investigation before injecting the injectable fluid.

11. The method of claim 8, wherein the isolating the volume comprises engaging a sealing apparatus.

12. The method of claim 8, wherein the NMR-active fluid is methane.

13. The method of claim 8, further comprising:
conveying an NMR measurement device into a wellbore proximate the region of investigation using a logging-while-drilling drillstring, a wireline, a slickline, or a coil tubing.

14. The method of claim 8, further comprising:
monitoring the pressure in the region of investigation.

15. The method of claim 8, wherein the parameter estimated is selected from the group consisting of: inter-granular porosity, intra-kerogen porosity, kerogen maturity, free gas volume, and adsorbed gas volume.

16. The method of claim 8, further comprising:
correlating kerogen maturity to intra-kerogen porosity based on the estimated parameter.

17. The method of claim 8, further comprising:
resolving, from the obtained measurement, a T2 distribution of gas molecules in intra-kerogen pores of the region of investigation.

18. The method of claim 8, further comprising:
resolving, from the obtained measurement, a T2 distribution of gas molecules in inter-granular porosity of the region of investigation.

19. The method of claim 8, further comprising:
maintaining a substantially constant pressure on the injectable fluid, and repeatedly performing the NMR measurement until the obtained measurement is substantially time-independent.

20. The method of claim 8, further comprising:
tuning an NMR measurement device to be consistent with the NMR-active injectable fluid.

* * * * *